United States Patent [19]

Mazzola et al.

[11] Patent Number: 5,280,500
[45] Date of Patent: Jan. 18, 1994

[54] METHOD AND APPARATUS FOR MULTILEVEL ENCODING FOR A LOCAL AREA NETWORK

[75] Inventors: Mario Mazzola, San Jose; Luca Cafiero, Palo Alto; Maurilio DeNicolo, Sunnyvale, all of Calif.

[73] Assignee: Crescendo Communications, Inc., Sunnyvale, Calif.

[21] Appl. No.: 775,641

[22] Filed: Oct. 10, 1991

[51] Int. Cl.$^5$ ............................................ H04L 25/49
[52] U.S. Cl. ........................................ 375/17; 341/56; 341/68; 341/76; 360/40
[58] Field of Search ............... 375/17, 36, 20, 19; 341/54, 56, 61, 57, 58, 68, 69, 88, 111, 177, 183, 76; 360/40, 41, 44; 371/56

[56] References Cited

U.S. PATENT DOCUMENTS

| | | | |
|---|---|---|---|
| 3,919,476 | 11/1975 | Torpie | 375/17 |
| 4,086,587 | 4/1978 | Lender | 341/56 |
| 4,211,929 | 7/1980 | Tamburelli. | |
| 4,618,941 | 10/1986 | Linder et al. | 375/17 |
| 4,916,689 | 4/1990 | Bielinski. | |

Primary Examiner—Curtis Kuntz
Assistant Examiner—Don N. Vo
Attorney, Agent, or Firm—Townsend and Townsend Khourie and Crew

[57] ABSTRACT

A multilevel encoding scheme for transmitted data that encodes data in a multilevel code wherein the amplitude of any transition is always exactly one level during any time interval. A single-level transition between any two adjacent levels during a time interval represents a logical "1"; no transition during a time interval represents a logical "0". In a specific embodiment, modulation is limited to three defined amplitude levels equally space in amplitude and encoding is according to a three-level code. A four-bit to five-bit encoding scheme may be used to distribute bits for minimizing d.c. offset. The input data is preferably further scrambled to minimize aberrations in the emissions spectrum of signal carried over unshielded media.

10 Claims, 5 Drawing Sheets

METHOD AND APPARATUS FOR MULTILEVEL ENCODING FOR A LOCAL AREA NETWORK

BACKGROUND OF THE INVENTION

This invention relates to an encoding technique suitable for high-speed local area network communications. It is contemplated that serial information is to be transmitted at data rates in excess of 100 MBaud over media and distances of interest (up to 50 meters on unshielded twisted pair cabling or Type "D" inside wiring (DIW), and up to 200 meters on Type 1 shielded cabling). The particular field of application is in Fiber Distributed Data Interface (FDDI).

FDDI is a high-speed Token Ring LAN protocol used primarily on fiber optic networks at data rates in excess of 100 MBaud. According to the FDDI Physical Media Dependent (PMD) layer protocol, encoding is Non Return to Zero Invert (NRZI) with a 4-bit to 5-bit conversion/translation at 125 MBaud which guarantees no more than a 14% deviation from a reference d.c. level.

FDDI allows two types of network stations or nodes on an electrically-connected ring. One class, Class A, may couple to a primary and a redundant secondary ring simultaneously. Another class, Class B, may be coupled to only one ring at a time. Class B nodes use a single connection to carry both incoming and outgoing lines of a ring. However, because of the dual fiber configuration of the primary ring, Class A nodes and Class B nodes can be interconnected only through an interfacing device referred to as a wiring concentrator. The wiring concentrator provides connection points into the primary ring that are suitable for Class B type connections.

The connection between Class B nodes and the wiring concentrator may be optical fiber or copper twisted pair wire, such as IBM Type 1 shielded wire. It would be advantageous to use Data Grade high twist wire or conventional telephone DIW unshielded twisted pair, particularly in a building already wired with such wiring. However, it has been considered difficult, if not impossible, to use such wiring at data rates comparable to the fiber optic speeds of 100 MBaud. As a consequence, there is a constraint on the rate of data exchange which prevents the use of such wiring in the connection between a Class B node and a data concentrator. Due to near-end crosstalk and attenuation, it is necessary to reduce high-frequency components in the modulated signal. Moreover, due to impulse noise, it is necessary to increase power levels to achieve the bit error rate of $10^{-12}$ BER necessary for reliable data transfer. However, FCC standards require that emission levels be limited in the range of 30 MHz to 1 GHz. Current FDDI modulation schemes cannot meet these constraints on unshielded twisted pair wiring. What is needed is a scheme for communication of baseband signals on copper wiring which is capable of data rates comparable to that of fiber optic cables while satisfying the stated constraints.

SUMMARY OF THE INVENTION

The present invention provides a multilevel encoding scheme for transmitted data that encodes data in a multilevel code wherein the amplitude of any transition is always exactly one level during any time interval. A single-level transition between any two adjacent levels during a time interval represents a logical "1"; no transition during a time interval represents a logical "0". In a specific embodiment, modulation is limited to three defined amplitude levels equally space in amplitude and encoding is according to a three-level code. The encoding may be derived directly from a two-level NRZI encoding scheme. The encoding scheme would be implemented at the Physical Media Dependent (PMD) layer, or lowest-level layer, of the FDDI protocol. A four-bit to five-bit conversion scheme may be used to distribute bits for minimizing d.c. offset. The input data is preferably further scrambled to minimize aberrations in the emissions spectrum of signal carried over unshielded media.

The invention will be better understood upon reference to the following detailed description in connection with the accompanying drawings.

DETAILED DESCRIPTION OF THE INVENTION

Figure 1A:
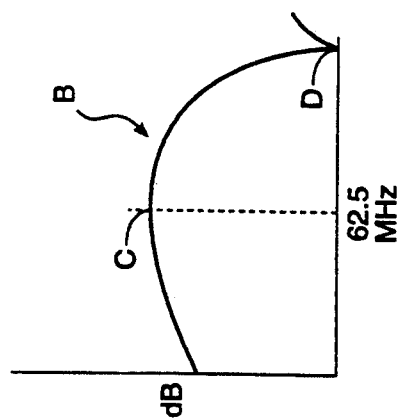
FIG. 1A is a timing diagram and a spectrum diagram representing prior art.
Figure 1A:
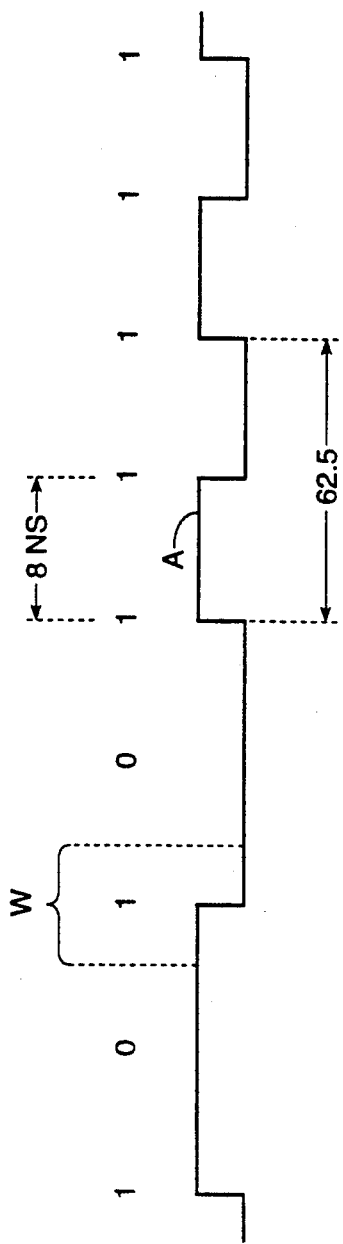
Figure 1B:
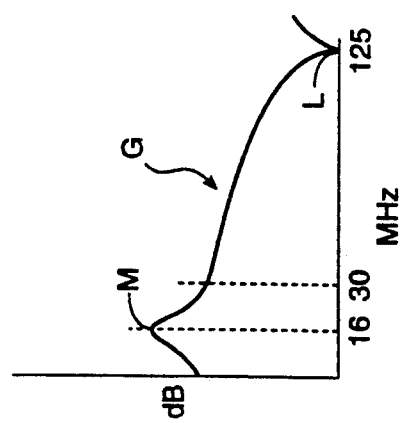
FIG. 1B is a timing diagram and a spectrum diagram representing a first embodiment of the invention.
Figure 1B:
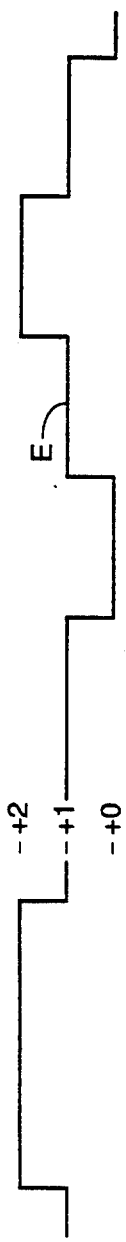
Figure 1C:
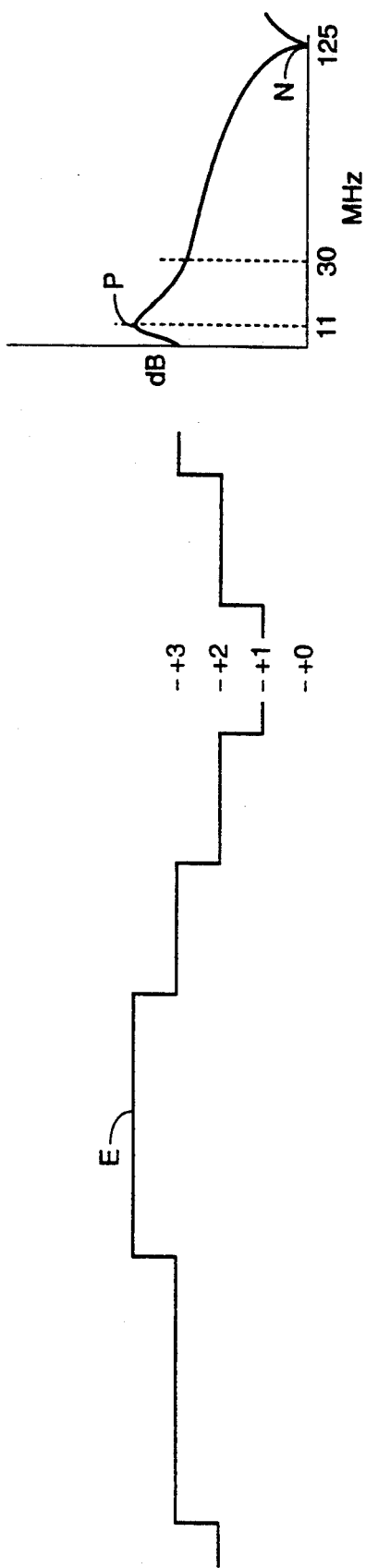
FIG. 1C is a timing diagram and a spectrum diagram representing a second embodiment of the invention.

The present invention is most readily implemented by accepting output of a conventional NRZI encoder providing an NRZI-standard 4B/5B output signal in accordance with ANSI Standard 3XT9.5. A specific embodiment is explained hereinafter. Referring to FIG. 1A, 1B and 1C there is shown a timing diagram and a spectrum for a sequence of bits encoding the sequence 101011111 in each three different codes, respectively, at a data rate of one bit per 8 ns. In FIG. 1A, an NRZI signal A of the prior art is shown. The presence of a logical 1 is indicated by a transition during a sampling window (W). The spectrum B of the prior art NRZI signal A has a peak C at 62.5 MHz and a null D at 125 MHz.

In FIG. 1B, a specific embodiment of the invention results in a multilevel encoded signal E of three possible amplitude levels 0, +1, +2. This encoding scheme is designated MLT-3. The spectrum G has a null at 125 MHz and a peak at about 16.4 MHz. Over 80% of the spectral energy of a scrambled signal is concentrated below 30 MHz. This is a significant improvement over a comparable NRZI signal, and it permits the transmission of information with a higher signal-to-noise ratio than NRZI encoding without violating FCC emission standards. The encoding is effected by further encoding an NRZI-type signal, such as a pure NRZ signal, an NRZI-4B/5B or a scrambled NRZI-4B/5B signal through the addition of a further level of amplitude and by effecting transitions (indicative of a logical "1") in the sequence: +1, +2, +1, 0, +1, +2, +1, 0, +1, etc.

FIG. 1C illustrates an alternative encoding scheme according to the invention. The specific embodiment of the invention results in a multilevel encoded signal F of four possible amplitude levels designated 0, +1, +2, +3. The encoding scheme is designated MLT-4. The spectrum G has a null N at 125 MHz and a peak P at about 11 MHz. Over 85% of the spectral energy is concentrated below about 30 MHz for a scrambled signal. However, even in the spectrum above 30 MHz, the spectrum of emissions is suppressed relative to the peak M at about 11 MHz. This is even a more significant improvement over a comparable NRZI signal, as it permits the transmission of information, without violating FCC emission standards, with a still higher signal-to-noise ratio as compared to NRZI encoding. The encoding of MLT-4 is effected by further encoding an NRZI-type signal, such as a pure NRZ signal, an NRZI-4B/5B signal or a scrambled NRZI-4B/5B signal through the addition of a further level of amplitude and by effecting transitions (indicative of a logical "1") in the sequence: 0, +1, +2, +3, +2, +1, 0, +1, 2, +3, +2, +1, 0, etc. The zero level is arbitrary and does not define the d.c. level of the signal on the media. As may be noted, the encoding scheme converges on a triangle function for a signal of randomly-distributed ones.

Figure 2:
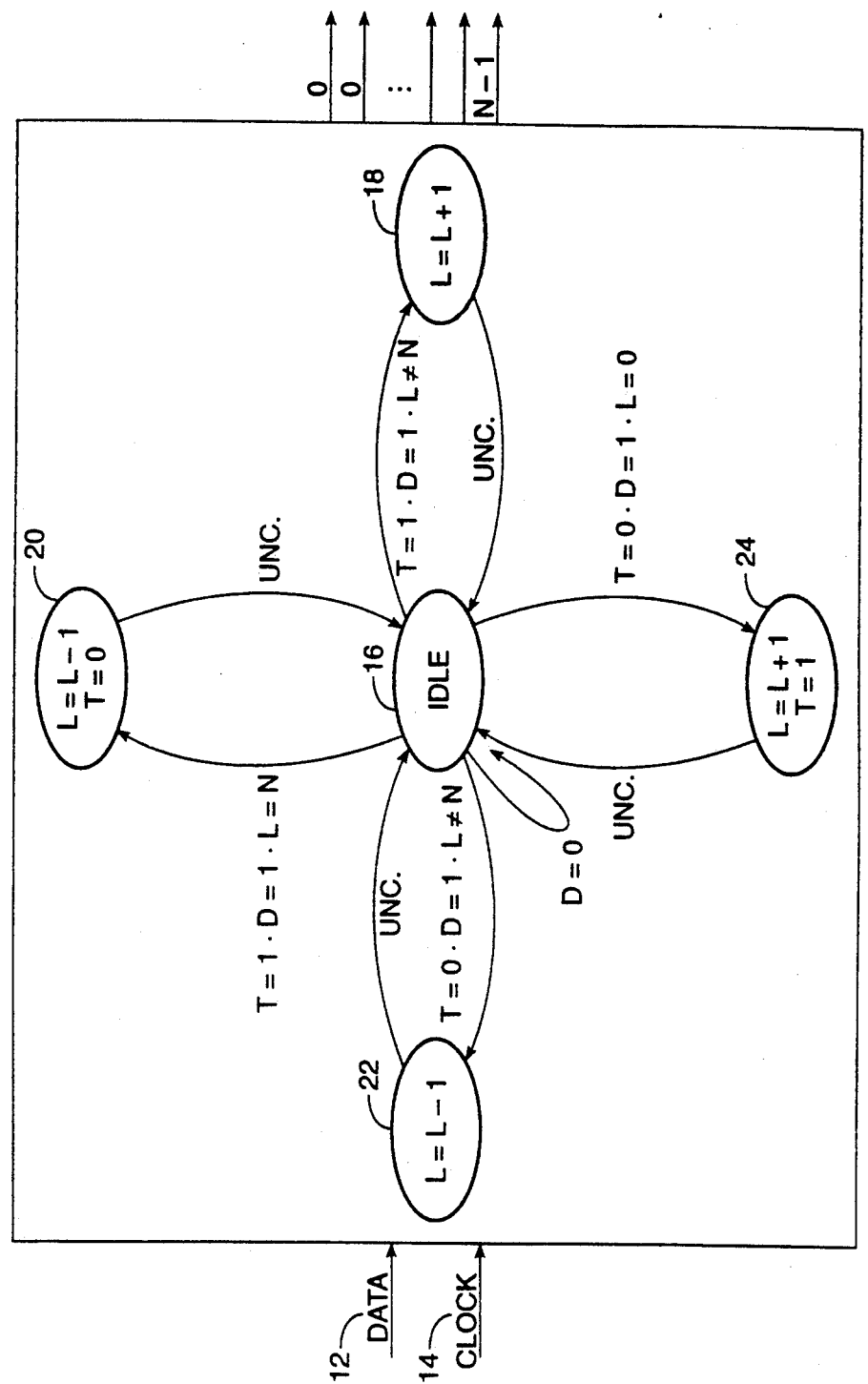
FIG. 2 is a transition diagram describing the logic of a general multiple-level encoder according to the invention.

Referring to FIG. 2, there is shown a transition diagram of a generalized MLT encoding technique. Input is in the form of data 12 and a clock signal 14. An idle state 6 is maintained for the input of any data representing a zero bit. Four other states are contemplated. A variable T indicates whether the amplitude is increasing ($T=1$) or decreasing ($T=0$). A variable L indicates the amplitude value in discrete increments ($L=0,1,2,3,\ldots, N$). A variable N is the number of level minus 1. (Levels$=N+1$). A variable D is the data value 1 or zero (0) only. A variable T is a temporary variable and a variable L represents the level at the output. An unconditional transition is indicated by a path labeled UNC and is always a transition to the idle state. Under conditions of $T=1$, $D=1$ and $L=N$, the transition is made to a state 18 wherein the variable L is incremented by 1, and there is an unconditional return to the idle state 16. Under conditions of $T=1$, $D=1$ and $L=N$, the transition is made to a state 20 wherein the variable L is decremented by 1, and T is set to zero; there is again an unconditional return to the idel state. Under conditions of $T=0$, $D=1$ and $L=N$, the transition is made to a state 22 wherein the variable L is decremented by 1, and there is an unconditional return to the idle state 16. Under conditions of $T=0$, $D=1$ and $L=0$, the transition is made to a state 24 wherein the variable L is incremented by 1, and T is set to 1; there is again an unconditional return to the idle state. Thus all states and transitions of the encoding scheme have been specified.

Figure 3:
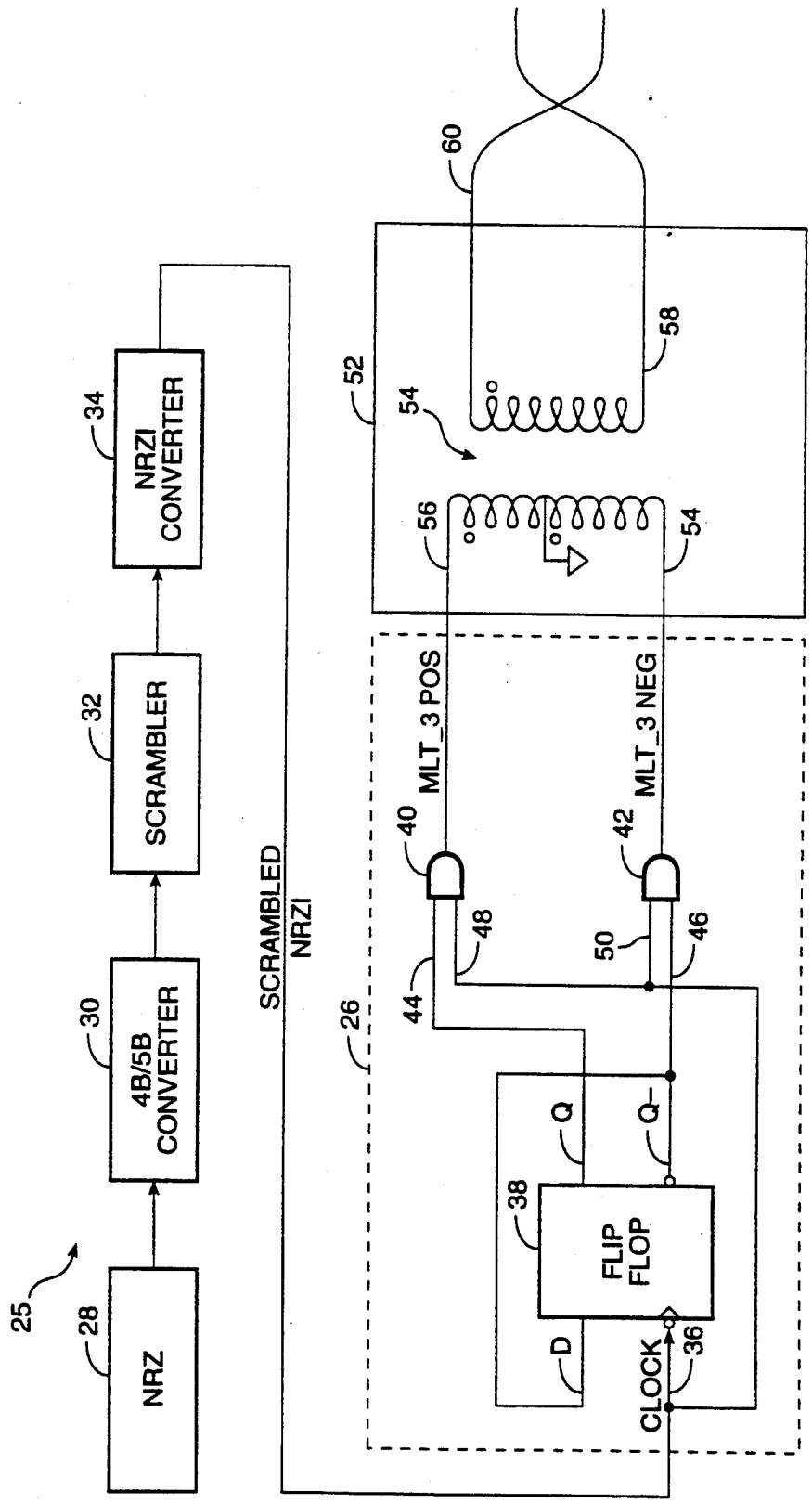
FIG. 3 is a schematic diagram of a specific embodiment of three-level encoder according to the invention.

Referring to FIG. 3, there is shown a specific embodiment of a circuit 25 employing an encoder 26 implementing an encoding scheme according to the invention. An NRZ signal at 100 MBPS is applied from an NRZ signal source 28 to a conventional 4B/5B converter 30 (such as is available from Advanced Micro Devices or Motorola). The 4B/5B converter 30 implements an conversion in accordance with ANSI 3XT9.5 standards for FDDI to produce an NRZ signal wherein every 4 bits is encoded as 5 bits. The purpose is to redistribute the data to assure that there is no more than a 14% deviation from a d.c. level in an NRZ-type signal. Thereafter the resultant enhanced NRZ signal optionally may be applied to a data scrambler 32 in order to further randomize the data to optimize spectrum usage. (The scrambler 32 is matched to an unscrambler at a receiver.) Various common implementations of scrambling may be used. The scrambler 32 may be any device which reorders the bits to create a greater homogeneity among binary values. The purpose is to enhance the homogeneity of data and thereby reduce the amplitude of undesired peaks in the emissions spectrum of the resultant output signal.

The resultant scrambled enhanced NRZ signal optionally may be applied to an NRZ-to-NRZI converter 34. An NRZI converter 34 implements the two-level encoding scheme whereby a data value of 1 is output as a transition in a two-level signal at a stated clock rate. Data is in the form of a clock signal 36 applied to an output utilization device, which in this case is an MLT-3 encoding circuit 26.

The MLT-3 encoding circuit 26 comprises a D-type flip-flop 38 which is clocked by the input clock 36 on the negative-going transition and wherein the inverted data output Q- is coupled to the data input D in feedback so that the next clock cycle causes a reversal of data state. The circuit 26 further comprises first dual-input AND gate 40 and second dual-input AND gate 42. The first input 44 of first dual-input AND gate 40 is coupled to receive the noninverted data output Q of flip-flop 38, and the second input 46 of second dual-input AND gate 42 is coupled to receive the inverted output Q- of flip-flop 38, which is also coupled to the input D. The second input 48 of first dual-input AND gate 40 and the first input 50 of second dual-input AND gate 42 are coupled in common to the noninverted clock input 36 which carries the NRZI data.

In operation, the AND gates 40, 42 are enabled in the alternative by the output data Q and Q-, and the state of the clock 36 is passed through the enabled AND gate 40 or 42 to a driver element 52. The driver element 52 comprises for example a transformer 54 with a center-grounded primary 56, the ends of opposing polarity being coupled to the outputs of the respective AND gates 40 and 42. The secondary 58 of transformer 54 is coupled to an output utilization means, such as a twisted pair 60 of signal wires, the transformer providing a balanced coupling to the pair 60 of wires. The signal output of the secondary 58 will be at three definable signal levels in response to the three-state drive of the primary 56.

An encoder according to the invention for higher-level codes is an extension of the circuitry of that shown in FIG. 3. For example a counter means may be employed to set the number of levels to be enabled, and means may be provided to respond to the selection signals from the counter means to set drive levels for a balanced coupling to a twisted pair.

The invention has now been explained with reference to a specific embodiment. Other embodiments will be apparent to those of ordinary skill in the art. It is therefore not intended that the invention be limited except as indicated by the appended claims.

What is claimed is:

1. A method for communication of data over wire communications media capable of undesired emission of radio frequency energy, comprising the steps of:

encoding an input data stream as a serial data stream;

modulating said serial data stream over at least three defined amplitude levels and at an established data rate, said data rate specifying a sequence of time intervals during which detection of a transition is indicative of a bit value, wherein a detection of a transition is indicative of a bit value, wherein a transition between adjacent defined amplitude levels during one of said time intervals represents a first bit value and wherein no transition between any defined amplitude levels represents a second bit value to produce a multiple-level transition code signal having a tailored emissions spectrum; and applying said multiple-level transition code signal to said communications media.

2. The method according to claim 1 wherein said encoding step further comprised converting said input data stream from a four-bit code to a five-bit code to reduce deviation from a nominal d.c. level.

3. The method according to claim 2 wherein said encoding step further comprises scrambling said input data stream to improve homogeneity of the emissions spectrum and thereby suppress high-amplitude regions of said emissions spectrum.

4. The method according to claim 1 wherein said modulating step comprises, for each bit value to be represented by a transition, selecting one of three possible amplitude levels in an output signal from among adjacent allowed amplitude levels.

5. A method for communication of data over wire communications media capable of undesired emission of radio frequency energy, comprising the steps of:

encoding an input data stream as a serial data stream; modulating said serial data stream as a multiple-amplitude-level signal according to an amplitude specified by a variable L at a preselected data rate, said data rate specifying a sequence of time intervals during which detection of a transition is indicative of a bit value, wherein a transition intervals represents a first bit value and wherein no transition between any defined amplitude levels represents a second bit value, said modulating comprising: '(a) maintaining an idle state for input of any data representing a zero bit;

(b) under conditions of variables T=1, D=1 and L⇌N, decrementing the variable L by 1, and unconditionally returning to the idle state; and (e) under conditions of T=0, D=1 and L=0, incrementing the variable L by 1, and setting variable T to 1, and unconditionally returning to the idle state;

wherein variable T indicates whether the amplitude is increasing (T=1) or decreasing (T=0);

variable L indicates the amplitude value in discrete increments (L=0,1,2,3, . . . ,N);

variable N is the number of level minus 1 (Levels =N+1); and variable D is the data value 1 or zero (0) only;

to produce a multiple-level transition code signal having a tailored emissions spectrum; and applying said multiple-level transition code signal to said communications media.

6. An apparatus for modulating a serial bit stream for communication of data over wire communications media capable of undesired emission of radio frequency energy comprising:

means coupled to receive a binary NRZ-type input signal as a clock signal, said clock signal indicating as data values transitions between binary levels of said clock signal for selecting a sequence of amplitude levels of at least three increments for an output signal, said amplitude levels differing sequentially by exactly one increment, to produce a multiple-level transition code signal; and means for applying said multiple-level transition code signal in balance to dual inputs of said wire communications media.

7. The apparatus according to claim 6 wherein said selecting means further includes means coupled to receive said NRZ-type input signal for converting said NRZ-type input signal from a 4-bit code to a 5-bit code to reduce deviation from a nominal d.c. level.

8. The apparatus according to claim 7 further including means coupled to said converting means for scrambling said NRZ-type input signal as said five-bit code ti improve homogeneity of spectrum of said radio frequency energy emission and thereby suppress high-amplitude regions of said spectrum.

9. The apparatus according to claim 6 wherein said selecting means comprises means, for each bit value to be represented by a transition, for selecting one of three possible amplitude levels in an output signal from among adjacent allowed amplitude levels.

10. The apparatus according to claim 9 wherein said selecting means comprises:

a D-type flip-flop;

a first dual-input AND gate; and a second dual-input AND gate;

said flip-flop having an inverting data output, a noninverting data output, a data input and a negative-transition-triggering clock input, said D-type flip-flop coupled to receive said NRZ-type input signal at said clock input, and having its inverting data output coupled to its data input;

said first dual-input AND gate and said second dual-input AND gate each having a first input coupled to receive said NRZ-type input signal, said first dual-input AND gate coupled to receive signals from said noninverting data output, and said second dual-input AND gate coupled to receive signals from said inverting data output, such that outputs of said first dual-input AND gate and said second dual-input AND gate are only alternately enabled to pass through said NRZ-type signal;

and wherein said applying means is coupled to respective outputs of said first dual-input AND gate and said second dual-input AND gate to receive output signals as levels of opposite polarity.

* * * * *